(12) United States Patent
Umezaki et al.

(10) Patent No.: US 12,057,326 B2
(45) Date of Patent: Aug. 6, 2024

(54) SUBSTRATE PROCESSING APPARATUS AND SUBSTRATE PROCESSING METHOD

(71) Applicant: Tokyo Electron Limited, Tokyo (JP)

(72) Inventors: Shota Umezaki, Koshi (JP); Hiroaki Inadomi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 411 days.

(21) Appl. No.: 17/389,883

(22) Filed: Jul. 30, 2021

(65) Prior Publication Data

US 2022/0044945 A1 Feb. 10, 2022

(30) Foreign Application Priority Data

Aug. 7, 2020 (JP) .................................. 2020-135142

(51) Int. Cl.
*H01L 21/67* (2006.01)
*H01L 21/673* (2006.01)
*H01L 21/677* (2006.01)
*H01L 21/02* (2006.01)

(52) U.S. Cl.
CPC .. *H01L 21/67034* (2013.01); *H01L 21/67126* (2013.01); *H01L 21/67383* (2013.01); *H01L 21/67748* (2013.01); *H01L 21/02101* (2013.01)

(58) Field of Classification Search
CPC .................................................. H01L 21/67034
See application file for complete search history.

(56) References Cited

FOREIGN PATENT DOCUMENTS

| JP | 2003-092244 A | 3/2003 |
|---|---|---|
| JP | 2013-254904 A | 12/2013 |
| JP | 2019-067863 A | 4/2019 |
| JP | 2019-087687 A | 6/2019 |

*Primary Examiner* — Jason Y Ko
(74) *Attorney, Agent, or Firm* — Pearne & Gordon LLP

(57) ABSTRACT

A substrate processing apparatus includes a transfer block in which a transfer device configured to transfer a substrate is placed, and a processing block provided adjacent to the transfer block. The processing block includes a liquid film forming unit configured to form a liquid film on a top surface of the substrate which is held horizontally, and a drying unit configured to replace the liquid film with a supercritical fluid to dry the substrate. The drying unit includes a pressure vessel having therein a drying chamber for the substrate, a cover body configured to close an opening of the drying chamber, and a supporting body configured to support the substrate horizontally in the drying chamber. The supporting body is fixed to the drying chamber. The transfer device advances into the drying chamber through the opening of the drying chamber while holding horizontally the substrate having the liquid film thereon.

13 Claims, 19 Drawing Sheets

SUBSTRATE PROCESSING APPARATUS AND SUBSTRATE PROCESSING METHOD

CROSS-REFERENCE TO RELATED APPLICATION

This application claims the benefit of Japanese Patent Application No. 2020-135142 filed on Aug. 7, 2020, the entire disclosure of which is incorporated herein by reference.

TECHNICAL FIELD

The various aspects and embodiments described herein pertain generally to a substrate processing apparatus and a substrate processing method.

BACKGROUND

A drying apparatus described in Patent Document 1 dries a substrate by replacing a liquid film formed on a top surface of the substrate, which is held horizontally, with a supercritical fluid. This drying apparatus is equipped with a rectangular box-shaped vessel main body, a cover body, and a substrate placing table. The cover body and the substrate placing table also serve as a carry-in/out mechanism for carrying the substrate in/out, and are configured to be movable back and forth. Patent Document 2 also describes the same technique as described in Patent Document 1.

Patent Document 1: Japanese Patent Laid-open Publication No. 2013-254904

Patent Document 2: Japanese Patent Laid-open Publication No. 2019-067863

SUMMARY

In one exemplary embodiment, a substrate processing apparatus includes a transfer block in which a transfer device configured to transfer a substrate is placed, and a processing block provided adjacent to the transfer block. The processing block includes a liquid film forming unit configured to form a liquid film on a top surface of the substrate which is held horizontally, and a drying unit configured to replace the liquid film with a supercritical fluid to dry the substrate. The drying unit includes a pressure vessel having therein a drying chamber for the substrate, a cover body configured to close an opening of the drying chamber, and a supporting body configured to support the substrate horizontally in the drying chamber. The supporting body is fixed to the drying chamber. The transfer device advances into the drying chamber through the opening of the drying chamber while holding horizontally the substrate having the liquid film formed thereon.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 1013 is a cross sectional view taken along a line B-B of FIG. 10A;

DETAILED DESCRIPTION

Figure 1:
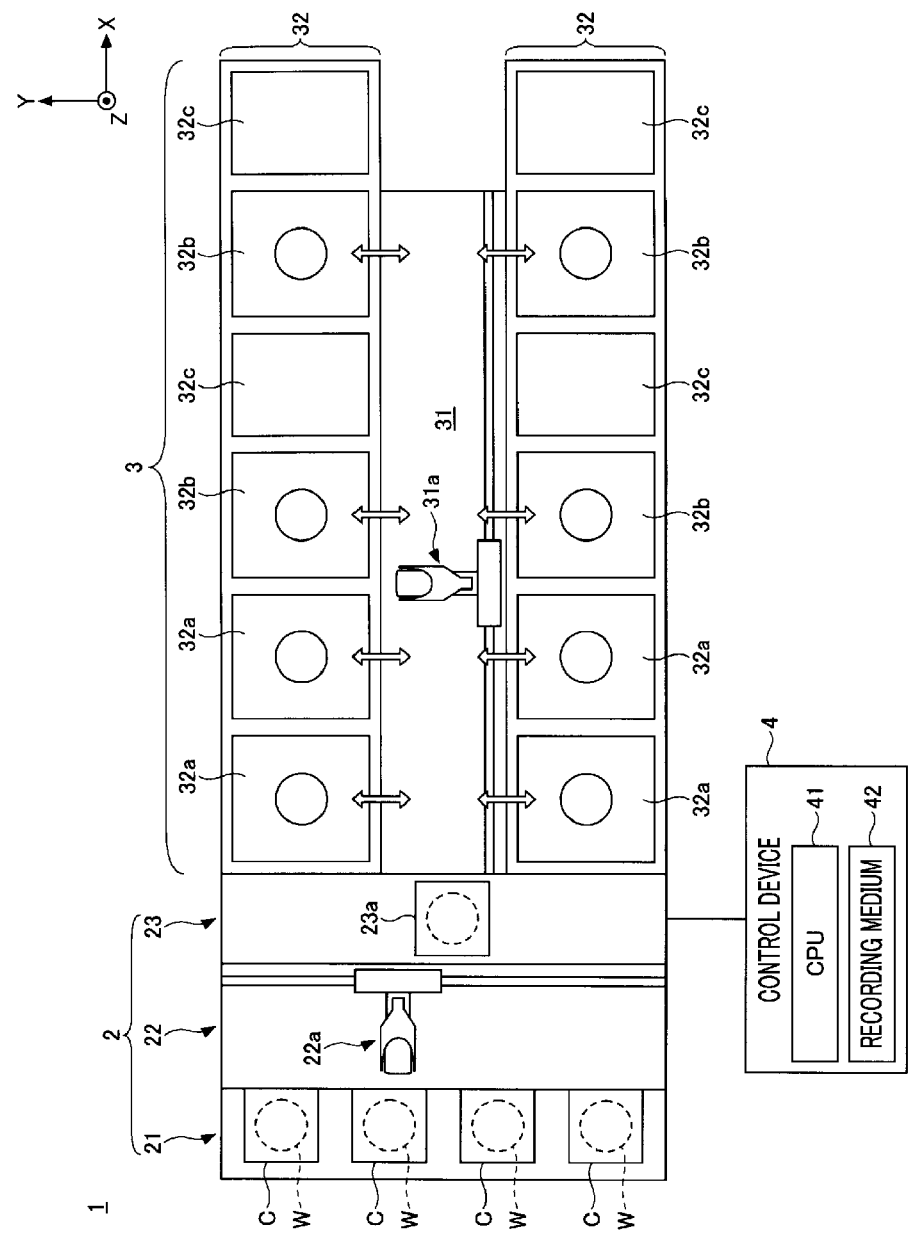
FIG. 1 is a plan view of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. In the various drawings, same or corresponding parts will be assigned same reference numerals, and redundant description thereof will be omitted. In the present specification, the X-axis direction, the Y-axis direction and the Z-axis direction are orthogonal to each other. Further, the X-axis direction and the Y-axis direction are horizontal directions, whereas the Z-axis direction is a vertical direction.

Figure 2:
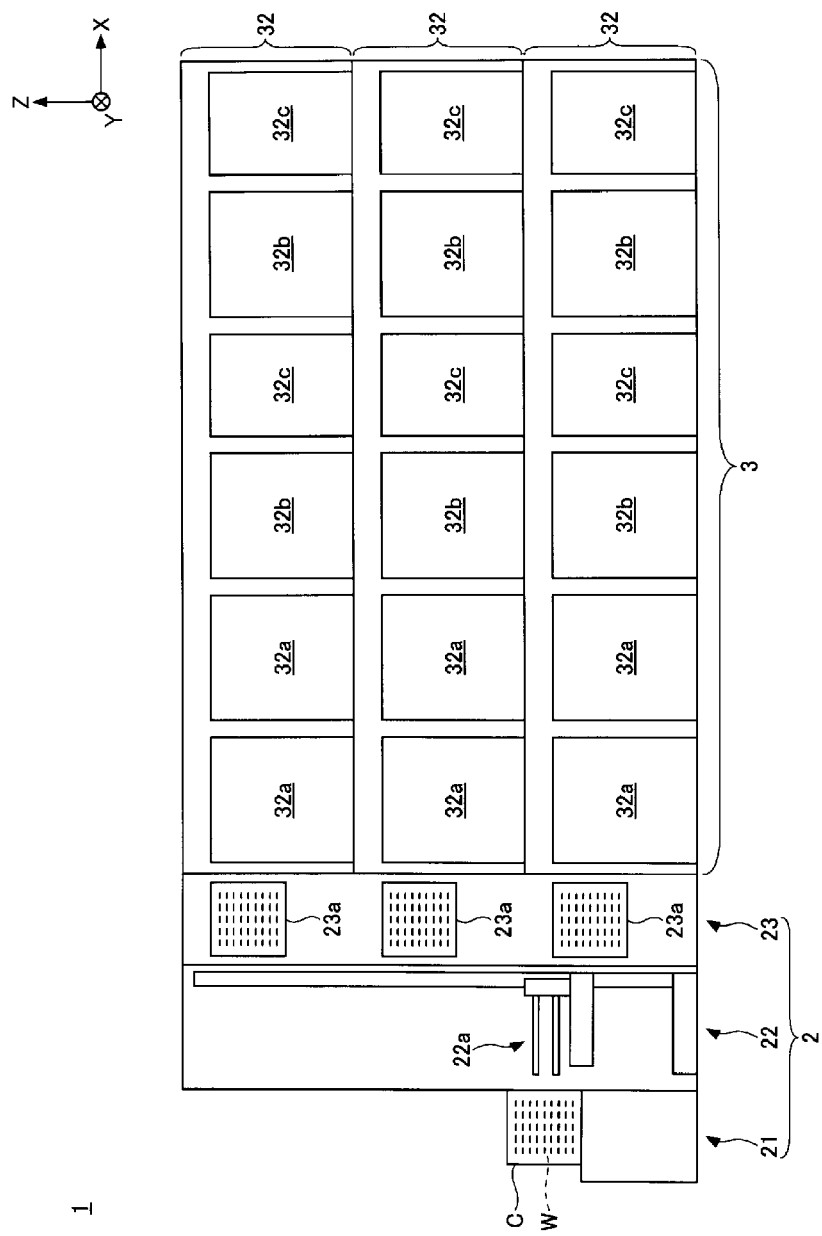
FIG. 2 is a front view of the substrate processing apparatus according to the exemplary embodiment.

First, referring to FIG. 1 to FIG. 3, a substrate processing apparatus 1 according to an exemplary embodiment will be described. As shown in FIG. 1, the substrate processing apparatus 1 is equipped with a carry-in/out station 2 and a processing station 3. The carry-in/out station 2 and the processing station 3 are provided adjacent to each other in the X-axis direction.

The carry-in/out station 2 is equipped with a placing table 21, a transfer section 22, and a delivery section 23. A plurality of carriers C is placed on the placing table 21. Each of these carriers C accommodates therein a multiple number of substrates W horizontally while maintaining a regular distance between the substrates W in a vertical direction.

The substrate W may include a semiconductor substrate such as a silicon wafer or a compound semiconductor wafer, or a glass substrate. The substrate W may further include a device such as an electronic circuit formed on a front surface of the semiconductor substrate or the glass substrate. The substrate W may have an irregularity pattern on the front surface thereof.

The transfer section 22 is provided adjacent to the placing table 21. A first transfer device 22a is disposed within the transfer section 22. The first transfer device 22a is configured to transfer the substrates W within the transfer section 22 to transfer the substrates W to/from a plurality of apparatuses disposed next to the transfer section 22.

The first transfer device 22a includes a first transfer arm configured to hold the substrate W. The first transfer arm is configured to be moved in horizontal directions (both the X-axis direction and the Y-axis direction) and the vertical direction, and is pivotable around a vertical axis. The number of the first transfer arm may be one or more.

The delivery section 23 is provided adjacent to the transfer section 22. The delivery section 23 includes a transition device 23a configured to accommodate therein the substrates W temporarily. As illustrated in FIG. 2, a plurality of transition devices 23a may be stacked in the vertical direction. Here, the layout and the number of the transition devices 23a are not particularly limited.

The processing station 3 is equipped with a transfer block 31 and a plurality of processing blocks 32. The transfer block 31 is provided adjacent to the delivery section 23. The transfer block 31 is of a rectangular parallelepiped shape. A second transfer device 31a is disposed within the transfer block 31. The second transfer device 31a is configured to transfer the substrates W between a plurality of apparatuses disposed next to the transfer block 31.

The second transfer device 31a includes a second transfer arm configured to hold the substrate W. The second transfer arm is configured to be moved in the horizontal directions (both the X-axis direction and the Y-axis direction) and the vertical direction, and is pivotable around a vertical axis. The number of the second transfer arm may be one or more.

The processing block 32 is disposed adjacent to the transfer block 31. The processing block 32 may be plural in number. As shown in FIG. 1, if a plurality of processing blocks 32 are symmetrically arranged at both sides of the transfer block 31 in the Y-axis direction, non-uniformity in processing time of the substrates W can be reduced between the processing blocks 32, so that non-uniformity in processing quality of the substrates W can be reduced. Further, as shown in FIG. 2, if the plurality of processing blocks 32 are stacked on top of each other in multiple levels in the vertical direction, a footprint of the processing blocks 32 can be reduced. Here, however, the layout and the number of the processing blocks 32 are not particularly limited.

Figure 3:
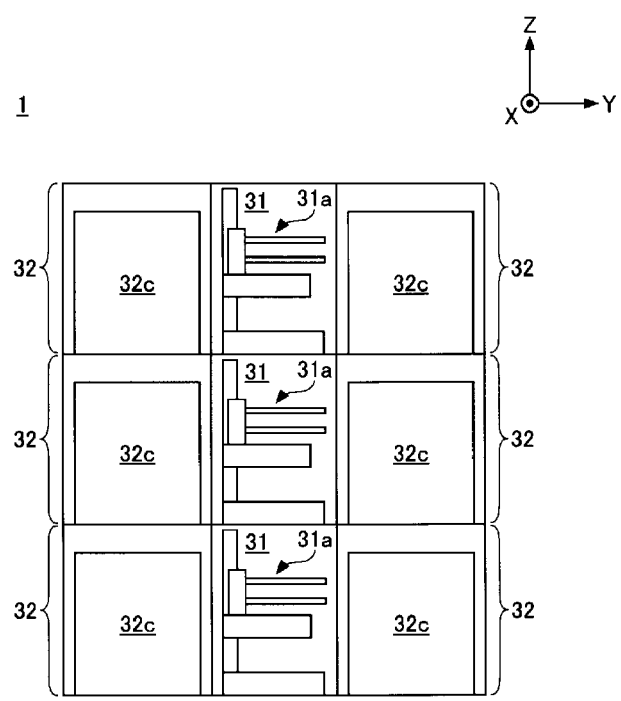
FIG. 3 is a side view of the substrate processing apparatus according to the exemplary embodiment.

In case that the plurality of processing blocks 32 are stacked in the multiple levels in the vertical direction, a plurality of transfer blocks 31 may also be stacked in multiple levels in the vertical direction, as shown in FIG. 3. The number of the levels of the transfer blocks 31 and the number of the levels of the processing blocks 32 are same. In this configuration, multiple substrates W can be transferred at different heights at the same time, so that the number of the substrates W processed per unit time can be increased. Here, however, the layout and the number of the transfer blocks 31 are not particularly limited.

The processing block 32 includes a liquid film forming unit 32a, a drying unit 32b, and a supplying unit 32c. The processing block 32 may have a plurality of (here, two) sets each including the liquid film forming unit 32a, the drying unit 32b and the supplying unit 32c. As will be described later, since the drying unit 32b can be scaled down according to the present exemplary embodiment, the processing block 32 can be scaled down even if the number of various units provided in the processing block 32 is increased.

The liquid film forming unit 32a is configured to supply a liquid onto a top surface of the substrate W horizontally held. The liquid film forming unit 32a includes, by way of example, a spin chuck configured to hold the wafer W horizontally, and a nozzle configured to discharge the liquid onto the top surface of the substrate W. The nozzle supplies the liquid onto a center of the top surface of the substrate W being rotated. The liquid is diffused from the center of the top surface of the substrate W toward a periphery thereof by a centrifugal force. As an example of the liquid, a chemical liquid, a rinse liquid and a drying liquid are supplied in this sequence. Multiple kinds of chemical liquids may be supplied, and the rinse liquid may be supplied between the supply of one chemical liquid and the supply of another chemical liquid.

In the liquid film forming unit 32a, a liquid film of the chemical liquid is formed on the top surface of the horizontally held substrate W; the liquid film of the chemical liquid is replaced by a liquid film of the rinse liquid; and the liquid film of the rinse liquid is replaced by a liquid film of the drying liquid. The chemical liquid may be, by way of non-limiting example, SC1 (an aqueous solution of ammonia and hydrogen peroxide) or DHF (Dilute HydroFluoric acid). The rinse liquid may be, by way of non-limiting example, DIW (DeIonized Water). The drying liquid may be, by way of example, but not limitation, an organic solvent such as IPA (IsoPropyl Alcohol).

The drying unit 32b is configured to dry the substrate W by replacing the liquid film formed on the top surface of the horizontally held substrate W with a supercritical fluid. The supercritical fluid is a fluid placed at a temperature above a threshold temperature, under a pressure above a threshold pressure and in a state of being undistinguishable between liquid and gas phases. By replacing the liquid film of the drying liquid or the like with the supercritical fluid, a collapse of the irregularity pattern of the substrate W, which is caused by a surface tension, can be suppressed. Details of the drying unit 32b will be discussed later.

The supplying unit 32c is configured to supply a fluid to the drying unit 32b. To elaborate, the supplying unit 32c is equipped with a supplying device group including a flowmeter, a flow rate controller, a back pressure valve and a heater, and has a housing accommodating the supplying device group. The supplying unit 32c supplies, for example, $CO_2$ into the drying unit 32b as the fluid.

When viewed from the top, the liquid film forming units 32a and the drying units 32b belonging to the same processing block 32 are arranged along a long side of the rectangular transfer block 31. The plurality of liquid film forming units 32a belonging to the same processing block 32 are adjacent to each other and placed closer to the transition device 23a than the drying units 32b are.

When viewed from the top, the drying units 32b and the supplying units 32c belonging to the same processing block 32 are arranged alternately in the X-axis direction. Each supplying unit 32c supplies the fluid to the drying unit 32b adjacent to the negative X-axis side thereof. The supplying units 32c may or may not be placed adjacent to the transfer block 31, since the substrate W is not carried into/from the supplying unit 32c.

When viewed from the top, the processing block 32 is protruded more than the transfer block 31 in the positive X-axis direction. The supplying unit 32c is disposed in this protruding portion. Three sides (the positive Y-axis side, the negative Y-axis side, and the positive X-axis side) of the supplying unit 32c are open, which increases maintenance workability.

In case that the plurality of processing blocks 32 are provided, the second transfer device 31a transfers the single substrate W between multiple units (for example, the liquid film forming unit 32a and the drying unit 32b) belonging to the same processing block 32. The second transfer device 31a does not transfer the substrate W between the plurality of processing blocks 32.

The substrate processing apparatus 1 is equipped with a control device 4. The control device 4 is, for example, computer, and includes a CPU (Central Processing Unit) 41 and a recording medium 42 such as a memory. The recording medium 42 stores therein a program for controlling various kinds of processings performed in the substrate processing apparatus 1. The control device 4 controls an operation of the substrate processing apparatus 1 by allowing the CPU 41 to execute the program stored in the recording medium 42.

Figure 4:
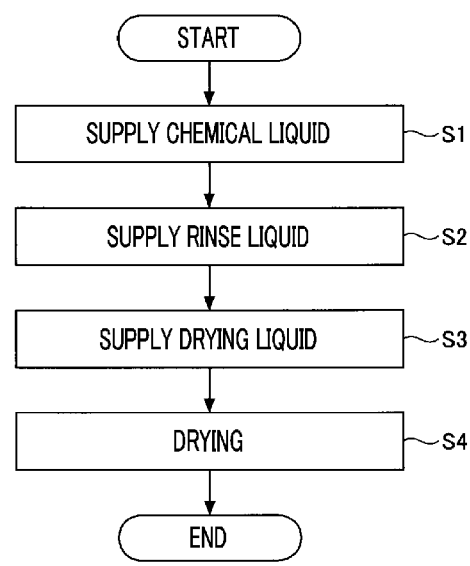
FIG. 4 is a flowchart illustrating a substrate processing method according to the exemplary embodiment.

Now, an operation of the substrate processing apparatus 1 will be described with reference to FIG. 4. Processes S1 to S4 shown in FIG. 4 are performed under the control of the control device 4.

First, the first transfer device 22a takes out the substrate W from the carrier C, and transfers the taken substrate W into the transition device 23a. Then, the second transfer device 31a takes out the substrate W from the transition device 23a, and transfers the taken substrate W into the liquid film forming unit 32a.

Subsequently, the liquid film forming unit 32a supplies the chemical liquid onto the top surface of the substrate W which is horizontally held (process S1). The chemical liquid is supplied to the center of the top surface of the substrate W being rotated, and diffused onto the entire top surface of the substrate W in a diametrical direction by the centrifugal force, thus forming a liquid film.

Thereafter, the liquid film forming unit 32a supplies the rinse liquid onto the top surface of the substrate W which is held horizontally (process S2). The rinse liquid is supplied to the center of the top surface of the substrate W being rotated, and diffused onto the entire top surface of the substrate W in the diametrical direction by the centrifugal force, thus forming a liquid film. As a result, the liquid film of the chemical liquid is replaced by the liquid film of the rinse liquid.

Next, the liquid film forming unit 32a supplies the drying liquid onto the top surface of the substrate W which is held horizontally (process S3). The drying liquid is supplied to the center of the top surface of the substrate W being rotated, and diffused onto the entire top surface of the substrate W in the diametrical direction by the centrifugal force, thus forming a liquid film. As a result, the liquid film of the rinse liquid is replaced by the liquid film of the drying liquid.

Then, the second transfer device 31a takes out the substrate W from the liquid film forming unit 32a, and transfers the taken substrate W into the drying unit 32b.

Subsequently, the drying unit 32b dries the substrate W by replacing the liquid film formed on the top surface of the horizontally held substrate W with the supercritical fluid (process S4). If the liquid film of the drying liquid or the like is replaced by the supercritical fluid, appearance of an interface between the liquid and the gas at the irregularity pattern of the substrate W can be suppressed. As a result, generation of a surface tension can be suppressed, so that a collapse of the irregularity pattern can be suppressed.

Finally, the second transfer device 31a takes out the substrate W from the drying unit 32b, and transfers the taken substrate W into the transition device 23a. Then, the first transfer device 22a takes out the substrate W from the transition device 23a, and puts the taken substrate W in the carrier C.

Figure 5A:
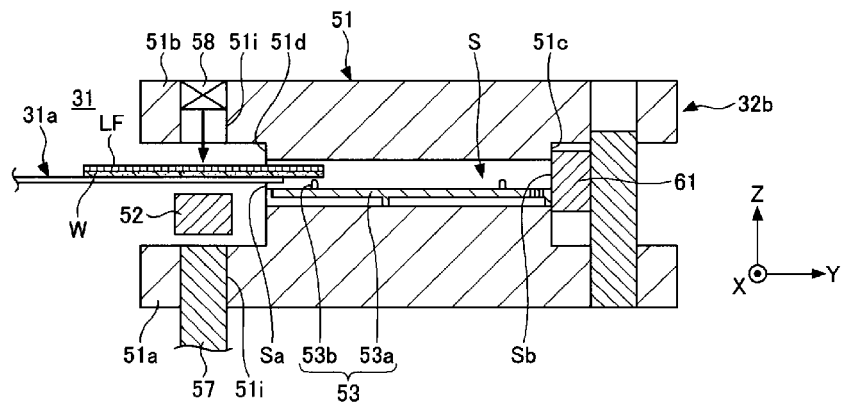
FIG. 5A to FIG. 5C are cross sectional views illustrating an example of a standby position of a cover body, an example of an opening position of the cover body, and an example of a closing position of the cover body, respectively.
Figure 5B:
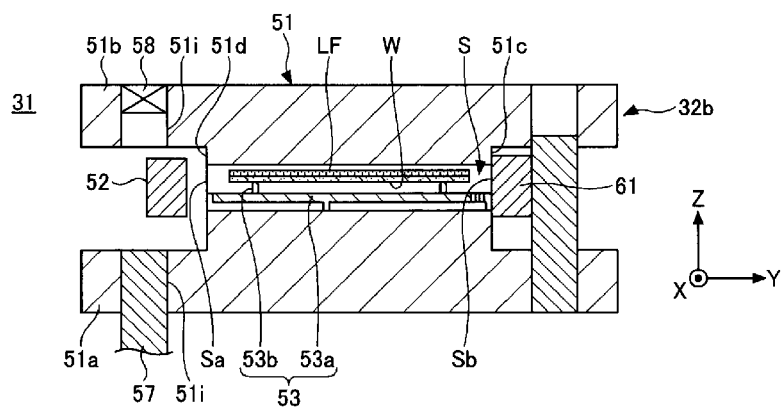
Figure 5C:
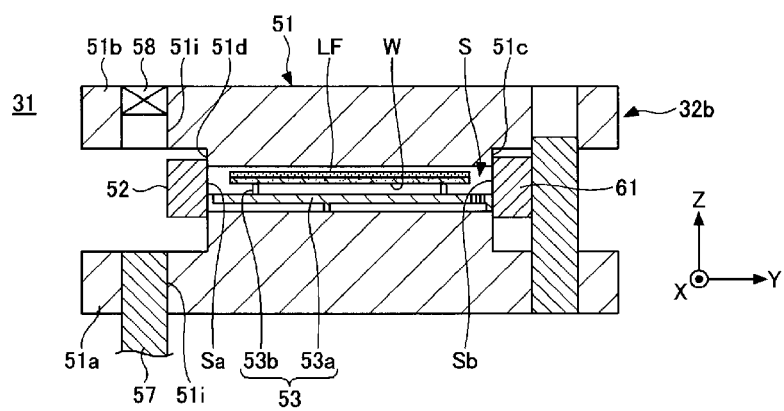

Now, the drying unit 32b will be explained with reference to FIG. 5A to FIG. 5C. The drying unit 32b shown in FIG. 5A to FIG. 5C is disposed at the positive Y-axis side of the transfer block 31. In the description of the drying unit 32b, a carry-in direction of the substrate W into a drying chamber S (i.e., positive Y-axis direction in FIG. 5A to FIG. 5C) is regarded as the front side, and a carry-out direction of the substrate W from the drying chamber S (i.e., negative Y-axis direction in FIG. 5A to FIG. 5C) is regarded as the rear side.

The drying unit 32b includes a pressure vessel 51 having therein the drying chamber S for the substrate W; a cover body 52 configured to close a first opening Sa of the drying chamber S; and a supporting body 53 configured to hold the substrate W horizontally in the drying chamber S. The first opening Sa is a carry-in/out opening for the substrate W. The substrate W is carried into the drying chamber S through the first opening Sa, and then carried out of the drying chamber S through the first opening Sa after it is dried in the drying chamber S.

The pressure vessel 51 includes, for example, a lower wall 51a, an upper wall 51b, a front wall 51c, a rear wall 51d, and a pair of sidewalls 51e and 51f (see FIG. 6A to FIG. 6C, etc.), and has the drying chamber S therein. The drying chamber S is of, for example, a rectangular parallelepiped shape. The first opening Sa having a rectangular shape is formed in the rear wall 51d, and a second opening Sb having a rectangular shape is formed in the front wall 51c.

The cover body 52 is provided at the rear of the rear wall 51d. The cover body 52 is configured to be moved back and forth between a closing position (see FIG. 5C) and an opening position (see, for example, FIG. 5B). The closing position is a position where the cover body 52 closes the first opening Sa. The opening position is located at the rear of the closing position, and is a position where the cover body 52 opens the first opening Sa.

In Patent Documents 1 and 2, the supporting body 53 is fixed to the cover body 52 and moved back and forth along with the cover body 52. The supporting body 53 is not fixed to the drying chamber S, and the supporting body 53 and the second transfer device 31a deliver the substrate W at an outside of the pressure vessel 51. For the purpose, an area for delivering the substrate W is provided at the outside of the pressure vessel 51.

In contrast, in the present exemplary embodiment, the supporting body 53 is fixed to the pressure vessel 51 and is not moved back and forth along with the cover body 52. The supporting body 53 is fixed to the drying chamber S, and the second transfer device 31a and the supporting body 53 deliver the substrate W in the drying chamber S. Thus, since the area for delivering the substrate W need not be provided at the outside of the pressure vessel 51, the drying unit 32b can be scaled down.

Further, according to the present exemplary embodiment, the supporting body 53 is fixed to the drying chamber S. Thus, unlike the case where the supporting body 53 is moved back and forth with respect to the pressure vessel 51, there occurs no backlash between sliding components. As a result, vibration of the supporting body 53 and vibration of the substrate W can be suppressed, so that an overflow of a liquid film LF can be suppressed.

The first opening Sa of the drying chamber S is formed toward the transfer block 31, unlike in Patent Documents 1 and 2. Thus, it is possible to carry the substrate W into the drying chamber S without needing to rotate the second transfer arm of the second transfer device 31a around the vertical axis. Since the substrate W can be carried into the drying chamber S without needing to be rotated, scattering of the drying liquid off the top surface of the substrate W can be avoided.

The cover body 52 is rotated between the opening position and a standby position (see FIG. 5A) to allow the second transfer device 31a to access the drying chamber S easily. The standby position is a position deviated from a carry-in/out path of the substrate W. When the substrate W is carried in or out, the cover body 52 stands by at the standby position. Accordingly, interference between the cover body 52 and the substrate W can be avoided.

Figure 6A:
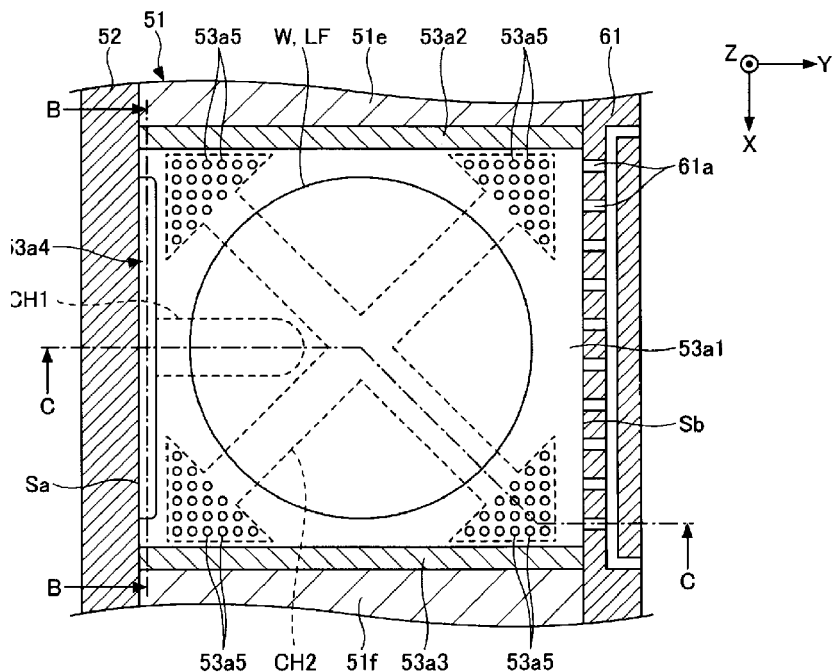
FIG. 6A is a horizontal cross sectional view illustrating an example of a rectifying plate.
Figure 6B:
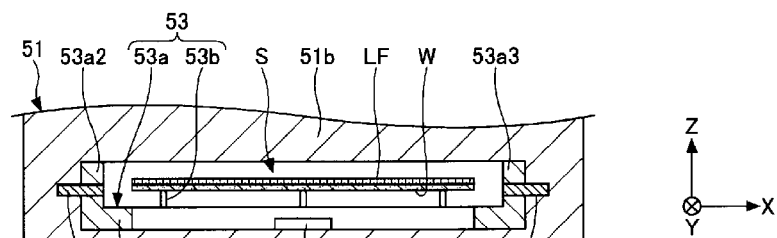
FIG. 6B and FIG. 6C are cross sectional views taken along lines B-B and C-C of FIG. 6A, respectively.
Figure 6C:
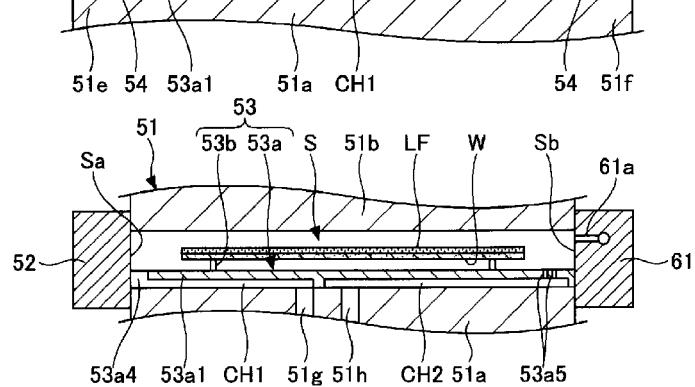

The supporting body 53 includes, as illustrated in FIG. 6A to FIG. 6C, a rectifying plate 53a configured to rectify a flow of the fluid in the drying chamber S; and a placing member 53b fixed to a top surface of the rectifying plate 53a. The rectifying plate 53a is fixed to the drying chamber S. The substrate W is placed on the placing member 53b.

As depicted in FIG. 6B, the placing member 53b forms a gap between the substrate W and the rectifying plate 53a to suppress contamination of a bottom surface of the substrate W. The placing member 53b includes, by way of example, a plurality of supporting pins. These supporting pins support the bottom surface of the substrate W here. However, the supporting pins may be configured to support an edge of the substrate W.

The rectifying plate 53a is formed to have a U-shape when viewed from the first opening Sa of the drying chamber S, and includes a horizontal plate 53a1 placed at the lower wall 51a of the pressure vessel 51, and a pair of vertical plates 53a2 and 53a3 provided at both ends of the horizontal plates 53a1 in the X-axis direction. The vertical plates 53a2 and 53a3 are respectively fixed to the side walls 51e and 51f of the pressure vessel 51. By way of example, each of the vertical plates 53a2 and 53a3 is provided with a screw hole. Screws are inserted into the screw holes of the vertical plates 53a2 and 53a3 and screw holes of the sidewalls 51e and 51f, respectively, thus allowing the rectifying plate 53a to be fixed to the pressure vessel 51.

As shown in FIG. 6A, when viewed from the top, the rectifying plate 53a has a drain opening 53a4 at an outside of the substrate W supported by the supporting body 53. The drain opening 53a4 is a hole through which the fluid is drained from above the rectifying plate 53a to below it. Depending on the position of the drain opening 53a4, a flow of the fluid in the drying chamber S is defined. For example, the drain opening 53a4 is provided at a rear end edge of the horizontal plate 53a1 in a straight line shape. A length of the drain opening 53a4 is larger than a diameter of the substrate W.

When viewed from the top, the rectifying plate 53a also has a supply opening 53a5 at an outside of the substrate W supported by the supporting body 53. The supply opening 53a5 is a hole through which the fluid is supplied from below the rectifying plate 53a to above it. Depending on the position of the supply opening 53a5, a flow of the fluid in the drying chamber S is defined. The supply opening 53a5 may be plural in number. For example, multiple supply openings 53a5 are provided at each of four corners of the horizontal plate 53a1. The position and the number of the supply openings 53a5 are not particularly limited. By way of another example, multiple openings 53a5 may be arranged in a ring shape along the circumference of the substrate W.

As depicted in FIG. 6C, the pressure vessel 51 includes a drain port 51g for draining the fluid from the drying chamber S; and a supply port 51h for supplying the fluid into the drying chamber S. The drain port 51g and the supply port 51h are formed in the lower wall 51a of the pressure vessel 51. The rectifying plate 53a is placed on the lower wall 51a.

A first path CH1 connecting the drain opening 53a4 and the drain port 51g and a second path CH2 connecting the supply opening 53a5 and the supply port 51h are independently formed at a bottom surface of the rectifying plate 53a. The first path CH1 and the second path CH2 are grooves formed on the bottom surface of the rectifying plate 53a. Since the first path CH1 and the second path CH2 are not connected, the draining of the fluid from the drying chamber S and the supplying of the fluid into the drying chamber S can be performed separately.

For example, the supply port 51h is formed at a center of the lower wall 51a. The second path CH2 is radially formed from a center of the rectifying plate 53a toward the four corners thereof, for example. Since the distance from the center of the rectifying plate 53a to each of the four corners thereof is same, it is possible to distribute the fluid toward the four corners of the rectifying plate 53a in a uniform manner.

Meanwhile, the drain port 51g is formed at the rear of the supply port 51h. The first path CH1 is formed so as not to be connected with the second path CH2, and is formed in a straight line shape backwards from the drain port 51g. The drain opening 53a4 is provided at the rear of the drain port 51g.

As illustrated in FIG. 9A to FIG. 10B, the drying unit 32b is equipped with a support frame 54 supporting the pressure vessel 51. The support frame 54 includes, for example, a horizontal base plate 54a, a plurality of pillars 54b protruding upwards from the base plate 54a, and a pair of horizontal plates 54c fixed to top surfaces of the plurality of pillars 54b.

The horizontal plates 54c are arranged at a distance therebetween in the X-axis direction. The pressure vessel 51 is fixed on the pair of horizontal plates 54c.

The drying unit 32b is equipped with a linearly moving mechanism 55 configured to move the cover body 52 back and forth between the closing position and the opening position; and a rotating mechanism 56 configured to rotate the cover body 52 between the opening position and the standby position. The rotating mechanism 56 includes, for example, rotation shafts 56a of the cover body 52 and a rotary actuator 56b configured to rotate the rotation shafts 56a. Meanwhile, the linearly moving mechanism 55 includes sliders 55a configured to hold bearings of the rotation shafts 56a, and a linearly moving actuator 55b configured to move the sliders 55a back and forth.

The rotation shafts 56a of the cover body 52 are symmetrically arranged in the X-axis direction with the cover body 52 therebetween. The sliders 55a are also symmetrically arranged in the X-axis direction with the cover body 52 therebetween. Guides 55c of the sliders 55a are respectively mounted to the pair of horizontal plates 54c. The rotary actuator 56b is fixed to one of the sliders 55a and moved back and forth along with this slider 55a. The linearly moving actuator 55b is fixed to one of the horizontal plates 54c.

The linearly moving actuator 55b is, by way of non-limiting example, a pneumatic cylinder, and serves to press the cover body 52 against the pressure vessel 51 by using a pressure of compressed air. A non-illustrated seal member for sealing a gap between the cover body 52 and the pressure vessel 51 can be pressed by a driving force of the linearly moving actuator 55b, so that the cover body 52 can be suppressed from obstructing a movement of a lock key 57 to be described later when the lock key 57 is fitted into an insertion hole 51i of the upper wall 51b of the pressure vessel 51. Further, the linearly moving actuator 55b may include a motor, and a ball screw configured to convert a rotary motion of the motor into a linear motion of the cover body 52.

The drying unit 32b is equipped with the lock key 57 configured to restrict the cover body 52 from being retreated from the closing position toward the opening position. The lock key 57 is fitted into the insertion hole 51i of the pressure vessel 51 to thereby restrict the retreat of the cover body 52. Thus, even when the pressure of the drying chamber S is increased as a result of supplying the fluid into the drying chamber S, the retreat of the cover body 52 can be restricted, so that a leak of the fluid can be suppressed.

The insertion hole 51i is formed through the lower wall 51a and the upper wall 51b in the Z-axis direction. The lower wall 51a and the upper wall 51b protrude backwards more than the rear wall 51d. The insertion hole 51i is formed in these protruding portions of the lower wall 51a and the upper wall 51b. The insertion hole 51i is plural in number, and these insertion holes 51i are arranged at a regular distance therebetween in the X-axis direction. The lock key 57 is plural in number as well, and these lock keys 57 are arranged at a regular distance therebetween in the X-axis direction. Each of these lock keys 57 is inserted into the corresponding insertion hole 51i of the lower wall 51a and the corresponding insertion hole 51i of the upper wall 51b.

Though the number of the lock keys 57 is not particularly limited, it may be three, for example. If three lock keys 57 are provided, a central portion of the cover body 52 in the X-axis direction can also be pressed, unlike a case where only two lock keys 57 are provided. As a result, when increasing the pressure of the drying chamber S by supplying the fluid into the drying chamber S, the central portion of the cover body 52 in the X-axis direction can be suppressed from being projected backwards more than an end portion of the cover body 52 in the X-axis direction.

The drying unit 32b is equipped with a film thickness gauge 58 configured to measure a film thickness of the liquid film LF formed on the top surface of the substrate W. The film thickness gauge 58 measures the film thickness of the liquid film LF by radiating laser to the substrate W from the insertion hole 51i of the pressure vessel 51 (more specifically, the upper wall 51b). By way of example, the film thickness gauge 58 measures the film thickness of the liquid film LF by measuring a phase difference between reflection light reflected on a top surface of the liquid film LF and reflection light reflected at an interface between the liquid film LF and the substrate W. A coating state of the substrate W by the liquid film LF can be inspected, and, thus, it can be checked whether the irregularity pattern of the substrate W is covered with the liquid film LF. A maximum thickness of the liquid film LF needs to be larger than a height difference of the irregularity pattern.

The insertion hole 51i of the pressure vessel 51 is formed near the first opening Sa of the drying chamber S. Since the film thickness gauge 58 radiates the laser to the substrate W from the insertion hole 51i, the film thickness gauge 58 is capable of measuring the film thickness of the liquid film LF immediately before the substrate W is accommodated in the drying chamber S. Thus, it is possible to inspect the coating state of the substrate W by the liquid film LF immediately before the liquid film LF is replaced by the supercritical fluid. Since the drying liquid is an organic solvent having high volatility, the film thickness of the liquid film LF needs to be measured immediately before the entire substrate W is accommodated in the drying chamber S.

The film thickness gauge 58 measures the film thickness of the liquid film LF while carrying the substrate W into the drying chamber S by the second transfer device 31a. The film thickness gauge 58 may measure the film thickness repeatedly while varying multiple measurement points of the film thickness with the second transfer device 31a. Since the film thickness of the liquid film LF can be measured at the multiple measurement points, the entire top surface of the substrate W can be inspected.

Figure 10A:
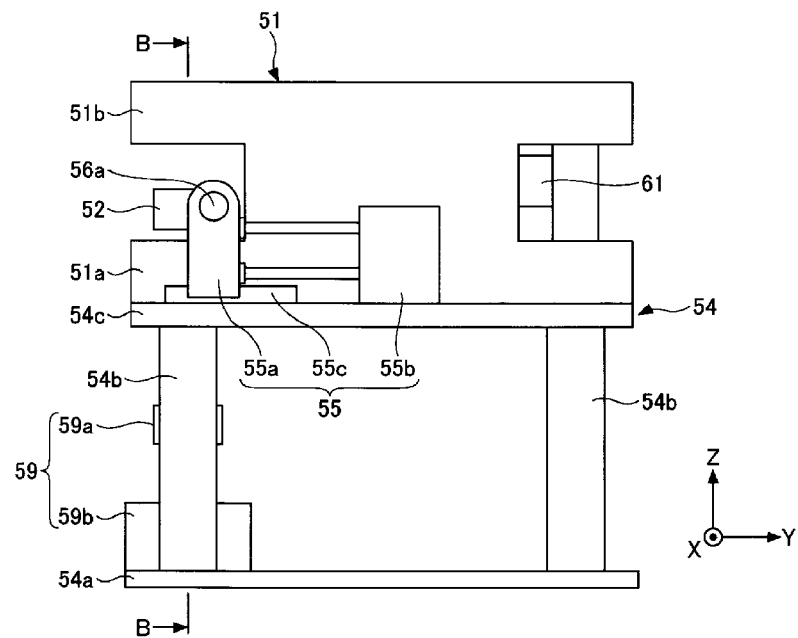
FIG. 10A is a side view illustrating a state of the drying unit when a substrate is carried in or out.
Figure 10B:
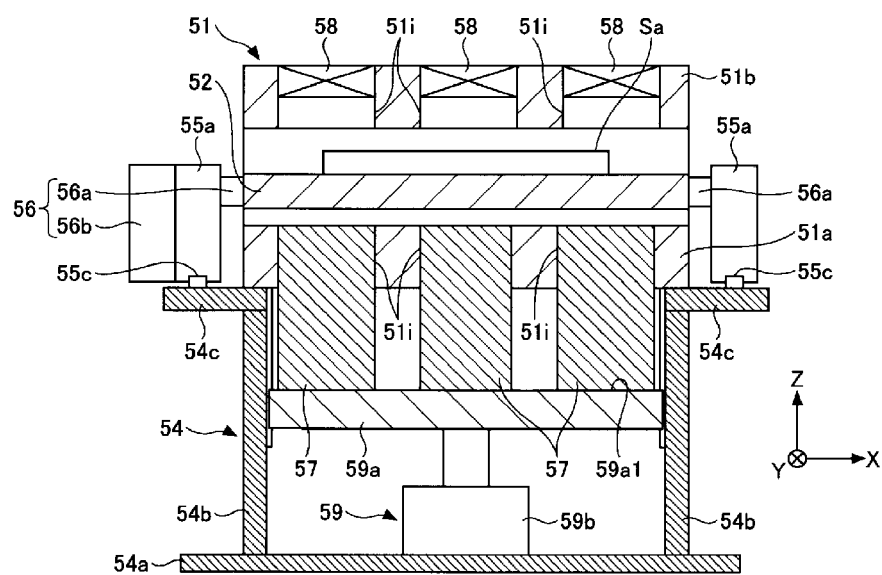

The drying unit 32b is equipped with an elevating mechanism 59 configured to move the lock key 57 between a locking position (see FIG. 9B) and a lock releasing position (see FIG. 10B). The locking position is a position where the lock key 57 restricts a retreat of the cover body 52 and where the lock keys 57 are inserted into the insertion holes 51i of the upper wall 51a and the lower wall 51b. The lock releasing position is a position where the lock key 57 allows the retreat of the cover body 52 and where the lock key 57 is pulled downwards from the insertion hole 51i of the upper wall 51b. The lock releasing position is set under the carry-in/out path of the substrate W to suppress interference between the lock key 57 and the substrate W.

The elevating mechanism 59 includes, by way of example, an elevation table 59a on which the plurality of lock keys 57 are placed; and a linearly moving actuator 59b configured to move the elevation table 59a up and down. The elevation table 59a has a horizontal surface 59a1 on which the lock keys 57 are placed. The linearly moving mechanism 59b is, by way of non-limiting example, a pneumatic cylinder, and serves to move the elevation table 59a up and down, thus allowing the lock keys 57 to be moved up and down. The linearly moving actuator 59b may include a motor and a ball screw configured to convert a rotary motion of the motor into a linear motion of the elevation table 59a.

Figure 11A:
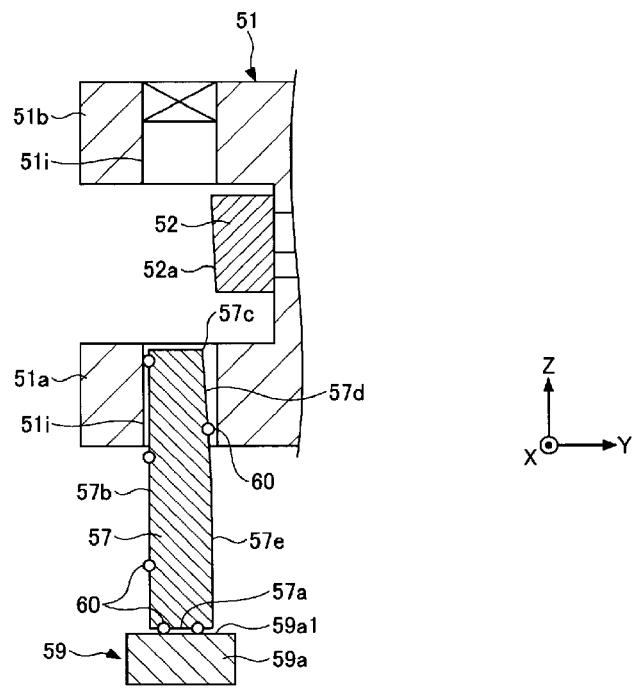
FIG. 11A is a cross sectional view illustrating an example state at the moment when a lock key is begun to be raised.
Figure 11B:
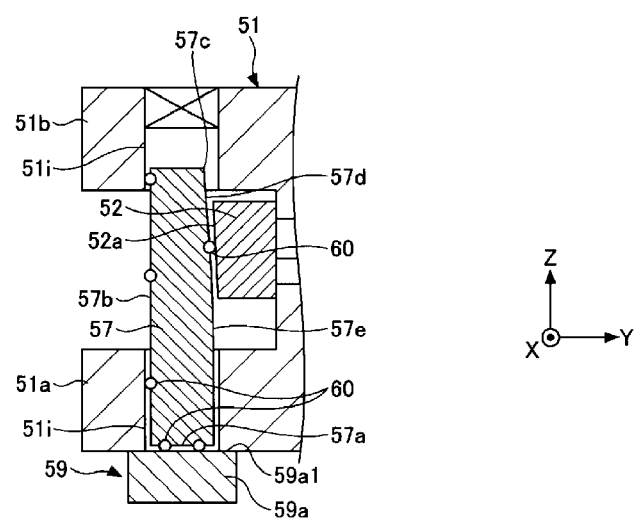
FIG. 11B is a cross sectional view illustrating an example state at the moment when the raising of the lock key is ended.

As shown in FIG. 11A and FIG. 11B, the drying unit 32b may be equipped with rolling bodies 60 mounted to the lock key 57 in a rollable manner. The rolling bodies 60 may be, by way of non-limiting example, balls, and they are pivotable around the centers thereof. As another example, the rolling bodies 60 may be rollers.

When the elevating mechanism 59 raises the lock key 57 from the lock releasing position to the locking position, the rolling bodies 60 roll in contact with the cover body 52 or the pressure vessel 51. The rolling bodies 60 can reduce friction resistance, thus inhibiting particle generation that might be caused by friction.

Multiple rolling bodies 60 may be provided at a bottom surface 57a of the lock key 57 as well, unlike in Patent Document 2. The rolling bodies 60 at the bottom surface 57a of the lock key 57 roll in contact with the horizontal surface 59a1 of the elevating mechanism 59. When the lock key 57 is raised, the lock key 57 can be horizontally moved within the insertion hole 51i, so that the friction resistance can be reduced.

The lock key 57 may be moved up and down with a rear surface 57b standing upright. If the lock key 57 is raised with the rear surface 57b tilted forwards as in Patent Document 2, an edge 57c of a top surface front end of the lock key 57 may be collided with a rear surface 52a of the cover body 52.

Multiple rolling bodies 60 are arranged at the rear surface 57b of the lock key 57 at a regular distance therebetween in the Z-axis direction, unlike in Patent Document 2. As compared to a case where only one rolling body is provided thereat, the friction between the lock key 57 and the pressure vessel 51 can be reduced. This effect is especially conspicuous when the rear surface 57b of the lock key 57 is maintained upright.

The lock key 57 may have, on a front surface thereof, an inclined surface 57d inclined forwards as it goes downwards from an upper end thereof; and a vertical surface 57e extending directly downwards from a lower end of the inclined surface 57d. By providing the inclined surface 57d, the edge 57c of the top surface front end of the lock key 57 can be suppressed from being collided with the rear surface 52a of the cover body 52.

A rolling body 60 may be provided at the inclined surface 57d of the lock key 57 as well, and it rolls in contact with the rear surface 52a of the cover body 52. The rear surface 52a of the cover body 52 faces the inclined surface 57d of the lock key 57 and is inclined forwards as it goes downwards from an upper end thereof.

Figure 12:
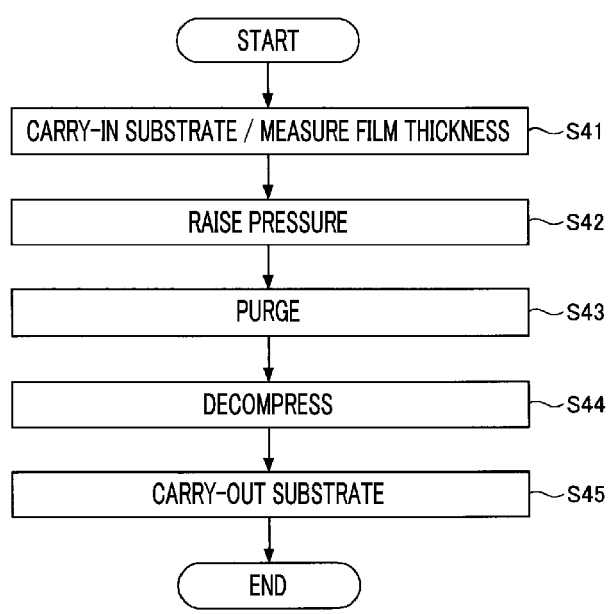
FIG. 12 is a flowchart illustrating an example of a process S4 of FIG. 4.

Now, details of the process S4 will be discussed with reference to FIG. 12. Processes S41 to S45 shown in FIG. 12 are performed under the control of the control device 4.

First, the second transfer device 31a horizontally holds the substrate W having the liquid film LF of the drying liquid formed thereon, and carries the substrate W into the drying chamber S within the pressure vessel 51 (process S41). In this process, the film thickness gauge 58 measures the film thickness of the liquid film LF. It can be checked whether the irregularity pattern of the substrate W is covered with the liquid film LF.

Then, the supporting body 53 fixed to the drying chamber S receives the substrate W from the second transfer device 31a, and holds the received substrate W horizontally. Thereafter, the second transfer device 31a is retreated to the outside of the drying chamber S through the first opening Sa of the drying chamber S.

Subsequently, the rotating mechanism 56 rotates the cover body 52 from the standby position to the opening position. Then, the linearly moving mechanism 55 moves the cover body 52 forwards from the opening position to the closing position. As a result, the cover body 52 closes the first opening Sa of the drying chamber S.

Then, the elevating mechanism 59 raises the lock keys 57 from the lock releasing position to the locking position. The lock keys 57 press the cover body 52 from the backside thereof, thus restricting the cover body 52 from being retreated. Thus, in a process S42 to be described later, a leak of a fluid can be suppressed.

Figure 7A:
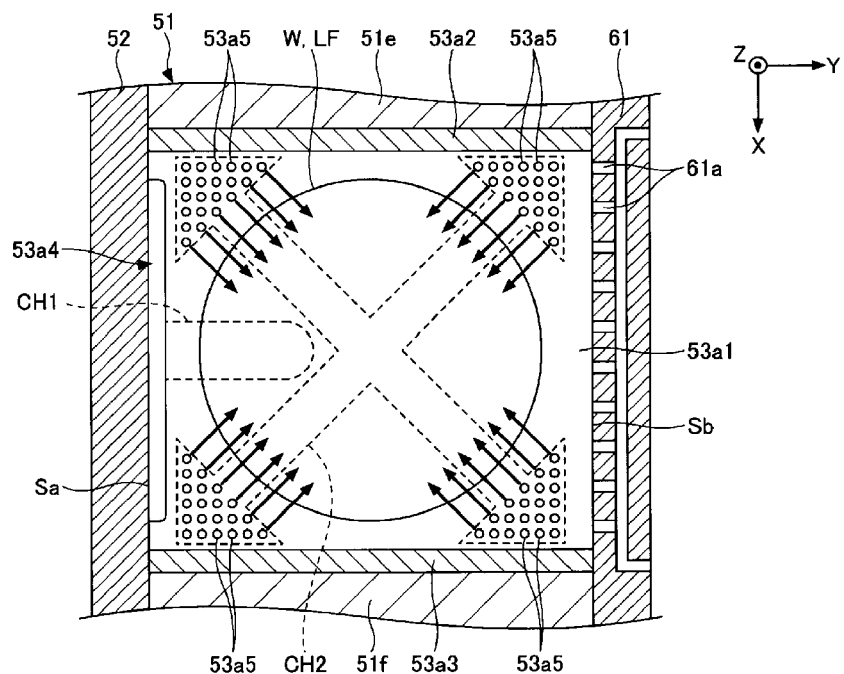
FIG. 7A and FIG. 7B are a horizontal cross sectional view and a vertical cross sectional view illustrating an example flow in a pressure-raising operation, respectively.
Figure 7B:
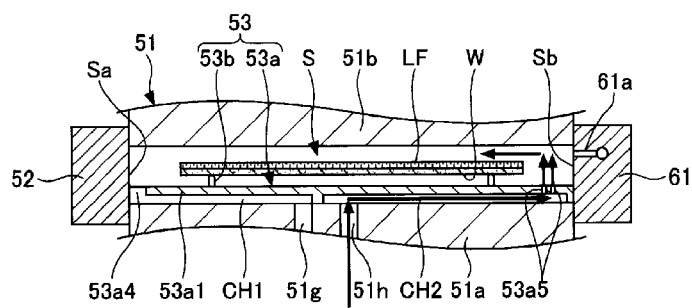

Next, the supplying unit 32c supplies the fluid such as $CO_2$ into the drying chamber S, thus raising the pressure of the drying chamber S (process S42). The fluid is supplied into the drying chamber S from the supply port 51h of the lower wall 51a, as shown in FIG. 7B. The fluid is discharged upwards from the supply openings 53a5 of the rectifying plate 53a. When viewed from the top, the multiple supply openings 53a5 are formed at each of the four corners of the rectifying plate 53a, as shown in FIG. 7A, and the fluid flows from an outer side of the substrate W toward an inner side thereof. A flow of the fluid heading toward the center of the substrate W from the periphery thereof is formed above the substrate W. This flow of the fluid suppresses the outflow of the liquid film LF to the outside of the substrate W. When viewed from the top, since the supply openings 53a5 are positioned at the outer side than the substrate W, the substrate W does not rattle even if the supply openings 53a5 discharge the fluid directly upwards. While increasing the pressure of the drying chamber S, the fluid is not drained from the drying chamber S but collected in the drying chamber S. The pressure of the drying chamber S is raised up to a set pressure equal to or higher than a threshold pressure.

Figure 8A:
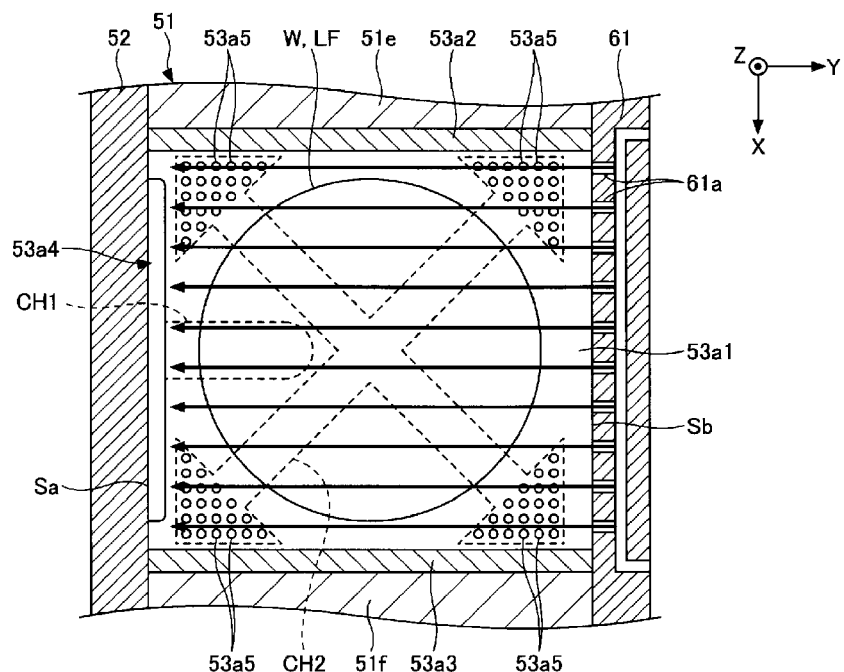
FIG. 8A and FIG. 8B are a horizontal cross sectional view and a vertical cross sectional view illustrating an example flow in a purging operation, respectively.
Figure 8B:
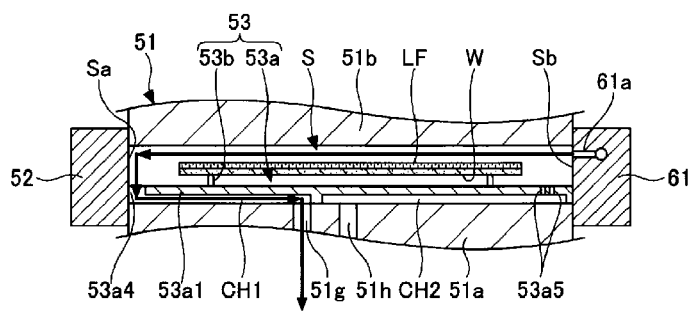
Figure 9A:
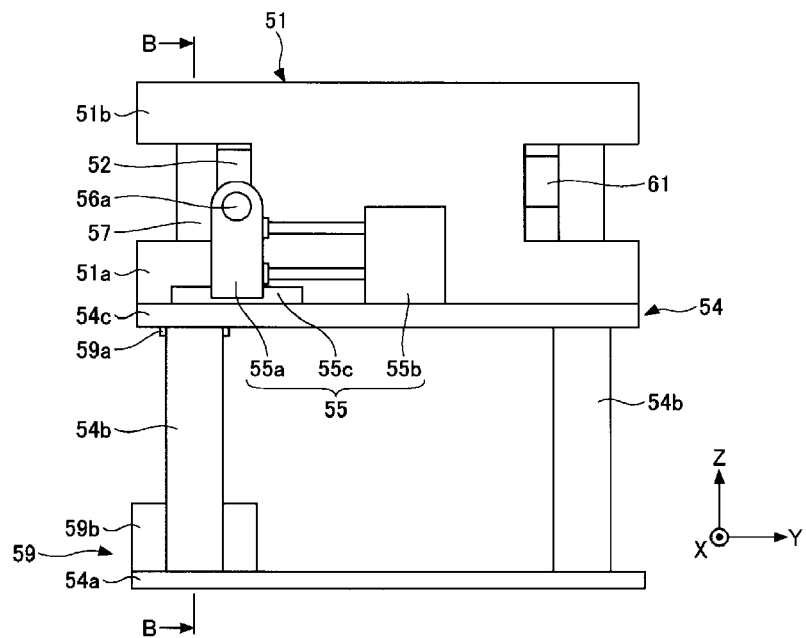
FIG. 9A is a side view illustrating a state of a drying unit when a fluid is supplied.
Figure 9B:
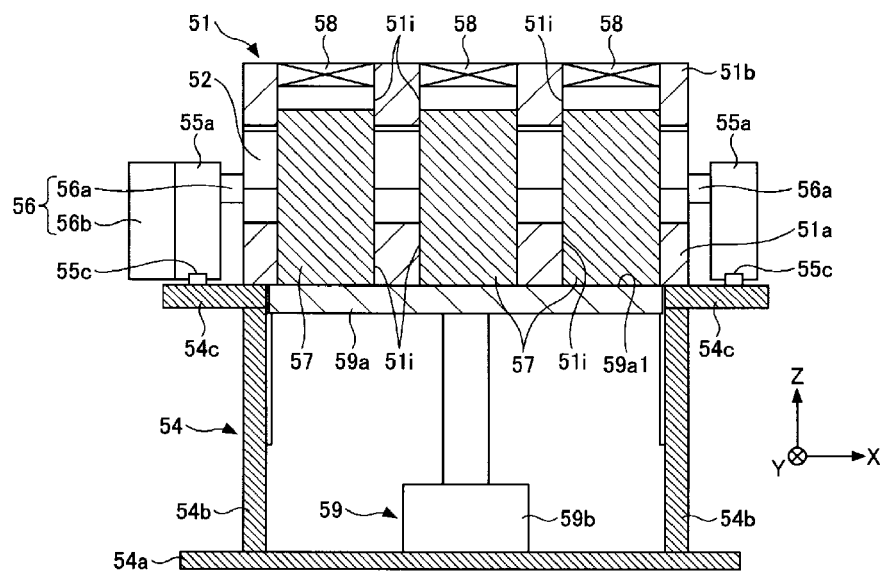
FIG. 9B is a cross sectional view taken along a line B-B of FIG. 9A.

Then, the supplying unit 32c supplies the fluid into the drying chamber S, and a non-illustrated drain unit drains the fluid from the drying chamber S, and purging the drying liquid dissolved in the fluid in the supercritical state is performed while keeping the pressure of the drying chamber S at the set pressure (process S43). At this time, the fluid is supplied into the drying chamber S from a discharge port 61a of a second cover body 61, as illustrated in FIG. 8B. The second cover body 61 is configured to close the second opening Sb of the drying chamber S, and is disposed to face the cover body 52. The discharge opening 61a of the second cover body 61 is plural in number, and these discharge openings 61a are arranged at a regular distance therebetween in the X-axis direction, as shown in FIG. 8A, to form a curtain-shaped flow above the substrate W. The fluid dissolves the drying liquid of the liquid film LF while it is passing through a space above the substrate W. After passing through the space above the substrate W, the fluid having the drying liquid dissolved therein passes through the drain opening 53a4 of the rectifying plate 53a and is drained to the outside of the drying chamber S. As a result, the liquid film LF is replaced by the supercritical fluid.

Subsequently, the supplying unit 32c stops the supply of the fluid into the drying chamber S, and the non-illustrated drain unit drains the fluid from the drying chamber S, thus reducing the pressure of the drying chamber S (process S44). The drain unit may include a vacuum pump or an ejector to shorten a time required for the decompression. The pressure of the drying chamber S is reduced to about an atmospheric pressure.

Then, the elevating mechanism 59 lowers the lock keys 57 from the locking position to the lock releasing position.

Then, the linearly moving mechanism 55 retreats the cover body 52 from the closing position to the opening position. Next, the rotating mechanism 56 rotates the cover body 52 from the opening position to the standby position.

Afterwards, the second transfer device 31*a* advances into the drying chamber S of the pressure vessel 51, receives the substrate W from the supporting body 53, and takes out the received substrate W (process S45).

Figure 13:
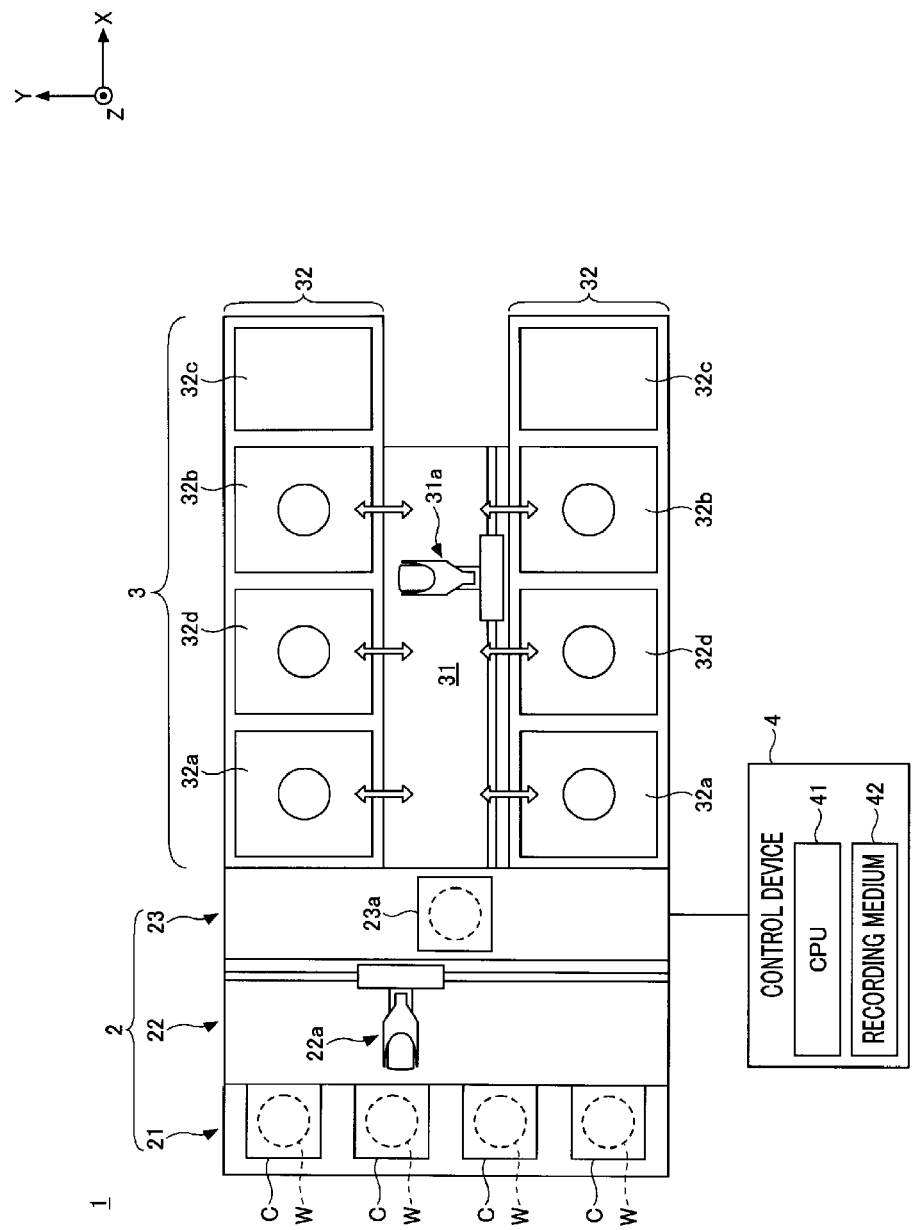
FIG. 13 is a plan view of a substrate processing apparatus according to a first modification example.
Figure 14:
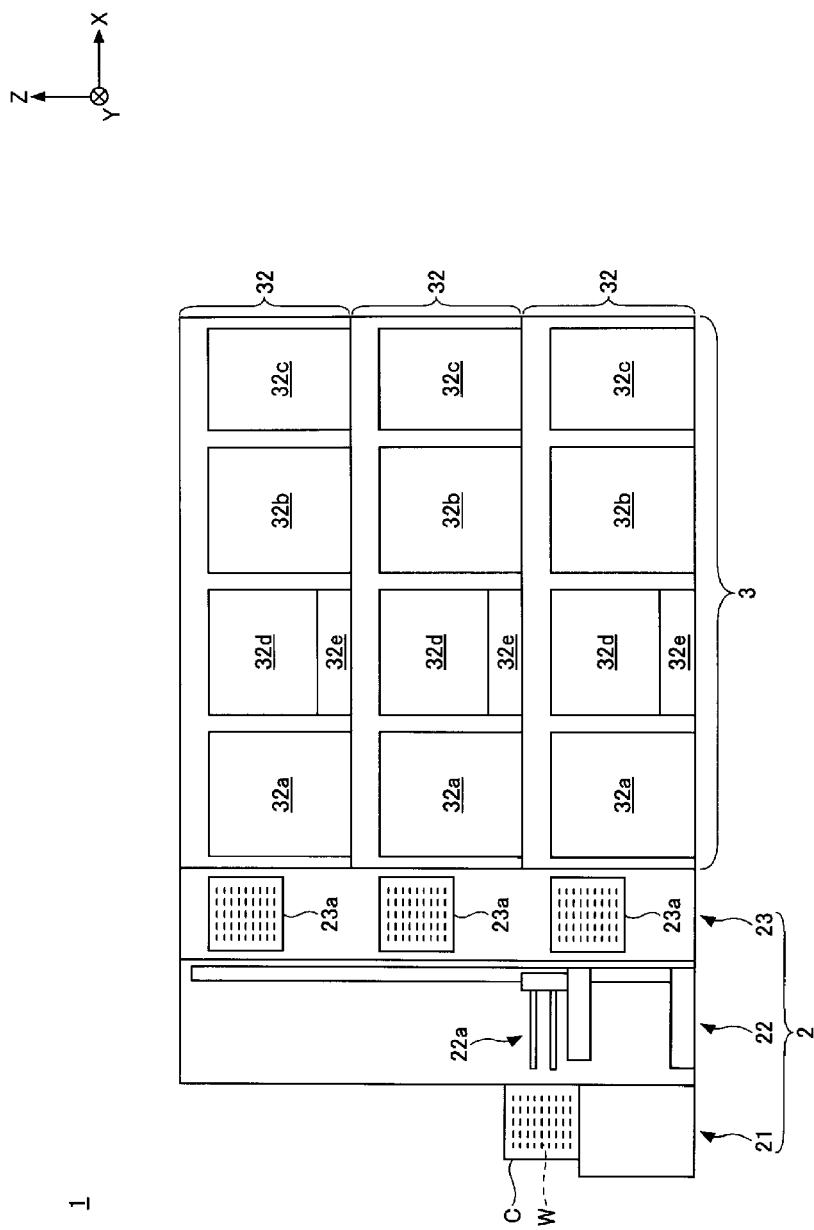
FIG. 14 is a front view of the substrate processing apparatus according to the first modification example.

Now, a first modification example of the substrate processing apparatus 1 will be explained with reference to FIG. 13 and FIG. 14. Below, the description will mainly focus on distinctive features between the present modification example and the above-described exemplary embodiment. A processing block 32 of the present modification example further includes an inspection unit 32*d* in addition to the liquid film forming unit 32*a*, the drying unit 32*b* and the supplying unit 32*c*, as shown in FIG. 13 and FIG. 14.

The inspection unit 32*d* is configured to inspect the coating state of the substrate W by the liquid film LF. The inspection unit 32*d* includes, for example, a weight gauge, and inspects whether the irregularity pattern of the substrate W is coated with the liquid film LF by measuring a weight of the substrate W. The inspection unit 32*d* may include the film thickness gauge as well.

If the processing block 32 has the inspection unit 32*d*, the coating state of the substrate W by the liquid film LF can still be inspected before the supercritical drying processing even if the drying unit 32*b* does not have the film thickness gauge 58. Here, however, the inspection unit 32*d* and the film thickness gauge 58 may be both used.

The formation of the liquid film LF, the inspection of the coating state, and the drying of the substrate W are performed in this sequence. Thus, when viewed from the top, the liquid film forming unit 32*a*, the inspection unit 32*d* and the drying unit 32*b* belonging to the same processing block 32 are arranged at a long side of the rectangular transfer block 31 in a row in this sequence, as shown in FIG. 13. With this configuration, it is possible to perform the inspection of the coating state while transferring the substrate W from the liquid film forming unit 32*a* to the drying unit 32*b*. Thus, the transfer path of the substrate W can be shortened.

The processing block 32 may further include a cleaning unit 32*e*, as shown in FIG. 14. The cleaning unit 32*e* is configured to remove an organic substance or the like adhering to the substrate W by radiating ultraviolet rays to the substrate W. The radiation of the ultraviolet rays is performed after the drying of the substrate W to remove a remnant of the drying liquid or the supercritical fluid.

As illustrated in FIG. 14, if the cleaning unit 32*e* and the inspection unit 32*d* are stacked on top of each other in the vertical direction, the footprint of the processing block 32 can be reduced. It does not matter which of the cleaning unit 32*e* and the inspection unit 32*d* is placed on top.

The number of the liquid film forming unit 32*a*, the drying unit 32*b*, the supplying unit 32*c*, the inspection unit 32*d*, and the cleaning unit 32*e* provided in the processing block 32 is one each. However, the kinds, the number and the layout of these units belonging to the processing block 32 are not particularly limited. By way of example, although the processing block 32 of the present modification example includes both the inspection unit 32*d* and the cleaning unit 32*e*, the processing block 32 may include either one of them.

In case that the processing block 32 includes the cleaning unit 32*e*, the liquid film forming unit 32*a*, the cleaning unit 32*e* and the drying unit 32*b* belonging to the same processing block 32 are arranged at a long side of the rectangular transfer block 31 in a row in this sequence, when viewed from the top. With this configuration, it is possible to perform the cleaning while transferring the substrate W from the drying unit 32*b* to the transition device 23*a*. Thus, the transfer path of the substrate W can be shortened.

Now, a second modification example of the substrate processing apparatus 1 will be described with reference to FIG. 15 and FIG. 16. Below, the description will mainly focus on distinctive features between the present modification example and the above-described exemplary embodiment. The substrate processing apparatus 1 according to the present modification example further includes a second processing block 33 in addition to the transfer block 31 and the processing blocks 32, as shown in FIG. 15.

Figure 15:
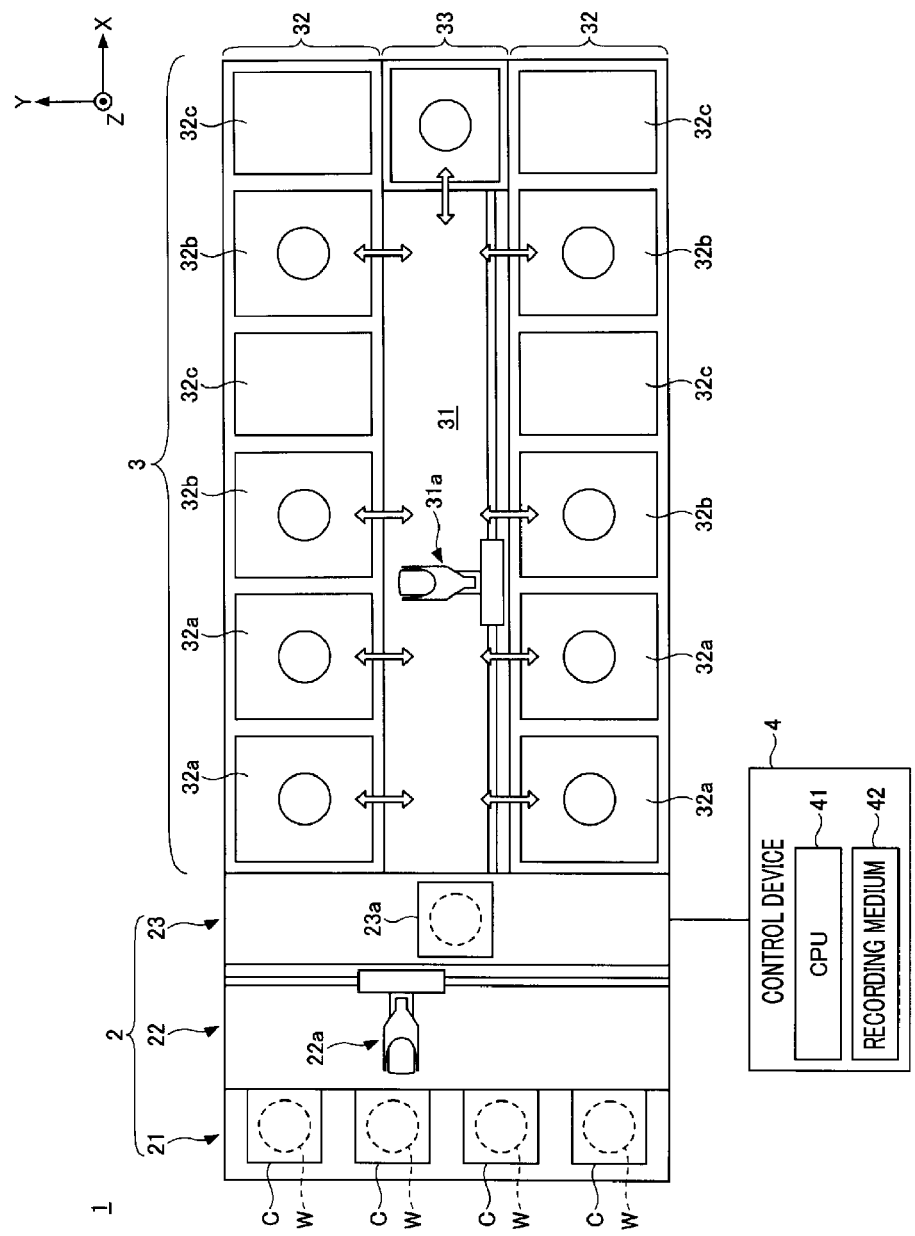
FIG. 15 is a plan view of a substrate processing apparatus according to a second modification example.
Figure 16:
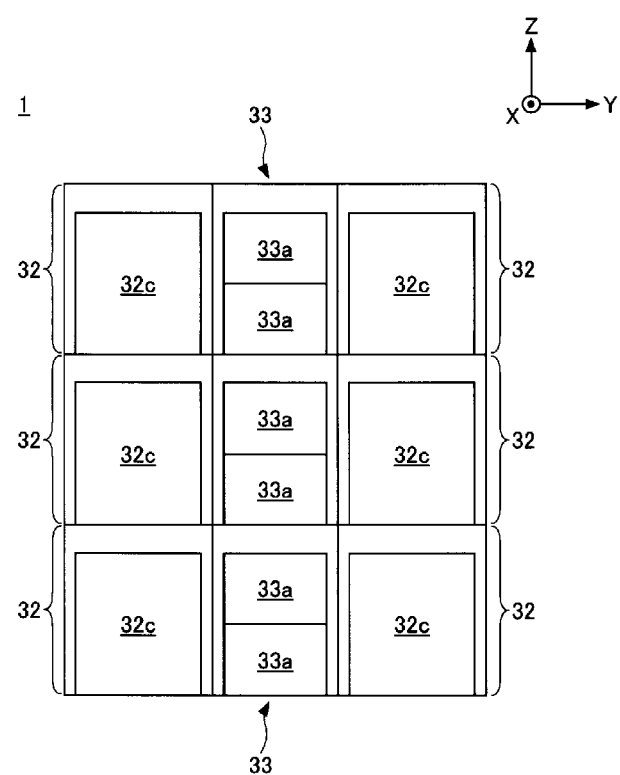
FIG. 16 is a side view of the substrate processing apparatus according to the second modification example.

When viewed from the top, as shown in FIG. 15, three sides of the second processing block 33 are surrounded by the transfer block 31 and two processing blocks 32 which are symmetrically disposed at both sides of the Y-axis direction with the transfer block 31 therebetween. The second processing block 33 includes an inspection unit 33*a*.

The inspection unit 33*a* is configured to inspect the coating state of the substrate W by the liquid film LF. The inspection unit 33*a* includes, for example, a weight gauge, and inspects whether the irregularity pattern of the substrate W is coated with the liquid film LF by measuring a weight of the substrate W. The inspection unit 33*a* may include the film thickness gauge as well.

If the second processing block 33 has the inspection unit 33*a*, the coating state of the substrate W by the liquid film LF can still be inspected before the supercritical drying processing even if the drying unit 32*b* does not have the film thickness gauge 58. Here, however, the inspection unit 33*a* and the film thickness gauge 58 may be both used.

The processing block 32 includes multiple sets (for example, two sets) each including the liquid film forming unit 32*a*, the drying unit 32*b* and the supplying unit 32*c*, and the second processing block 33 includes multiple (for example, two) inspection units 33*a*. Here, if the multiple inspection units 33*a* are stacked on top of each other in the vertical direction as shown in FIG. 16, a footprint of the processing block 32 can be reduced.

Figure 17:
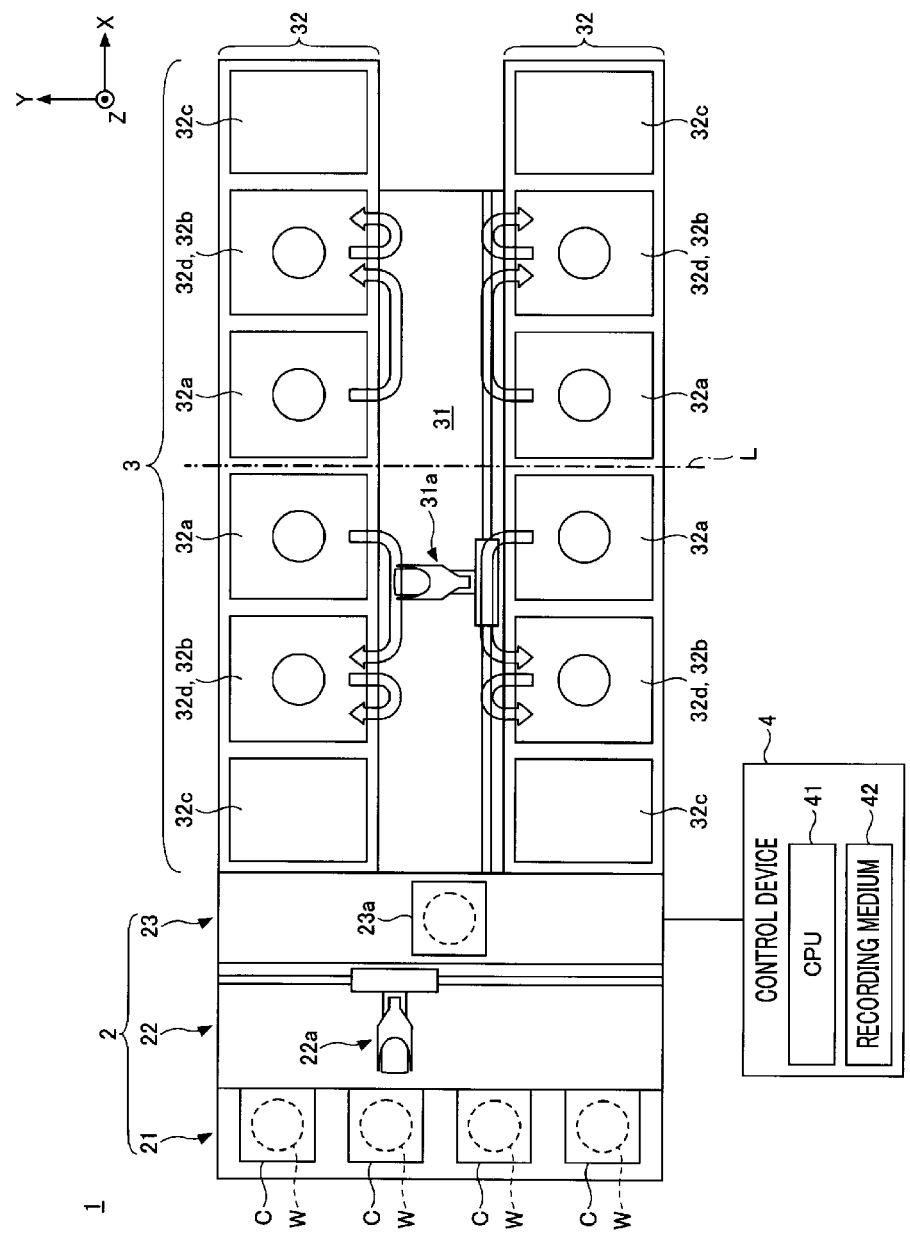
FIG. 17 is a plan view of a substrate processing apparatus according to a third modification example.

Now, a third modification example of the substrate processing apparatus 1 will be explained with reference to FIG. 17 and FIG. 18. Below, the description will mainly focus on distinctive features between the present modification example and the above-described exemplary embodiment. In the present modification example, as illustrated in FIG. 17, one set of one liquid film forming unit 32*a* and one drying unit 32*b* and another set of one liquid film forming unit 32*a* and one drying unit 32*b* are arranged to be axially symmetrical with respect to an imaginary line L in each same processing block 32, when viewed from the top. Accordingly, a length of the transfer path of the substrate W in each set becomes equal. Thus, non-uniformity in processing quality of substrates W between the individual sets can be reduced.

In the present modification example, in each processing block 32, the two liquid film forming units 32*a* are placed adjacent to each other; the two drying units 32*b* are respectively placed outwardly next to the two liquid film forming units 32*a*, and two supplying units 32*c* are respectively arranged outwardly next to the two drying units 32*b*. Further, the liquid film forming units 32*a* and the supplying units 32*c* may be reversely placed. That is, the two supplying units 32*c* may be placed adjacent to each other; the two drying units 32*b* may be respectively placed outwardly next to the two supplying units 32*c*; and the two liquid film forming units 32a may be respectively disposed outwardly next to the two drying units 32b.

Figure 18:
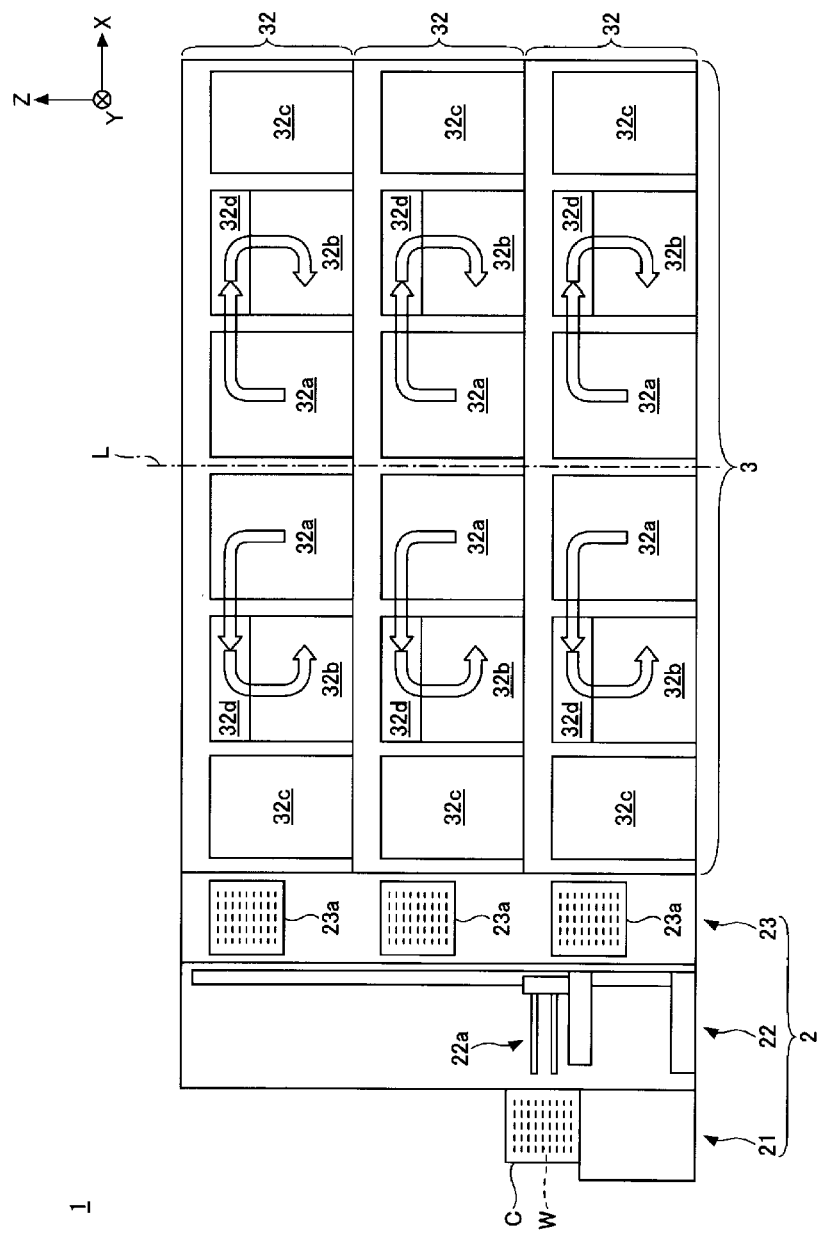
FIG. 18 is a front view of the substrate processing apparatus according to the third modification example.

In the present modification example, the inspection unit 32d and the drying unit 32b are stacked on top of each other in the vertical direction, as illustrated in FIG. 18. It does not matter which of the inspection unit 32d and the drying unit 32b is placed on top. If the inspection unit 32d and the drying unit 32b are stacked in the vertical direction, the footprint of the processing block 32 can be reduced. Further, since the inspection units 32d are arranged to be axially symmetrical with respect to the imaginary line L, the length of the transfer path of the substrate W in each set becomes equal. Thus, non-uniformity in processing quality of substrates W between the individual sets can be reduced. The substrate W is transferred into the liquid film forming unit 32a, the inspection unit 32d and the drying unit 32b in this sequence, as indicated by arrows in FIG. 17 and FIG. 18.

The inspection unit 32d measures a weight of the substrate W after the liquid film LF is formed thereon. The weight of the substrate W before the formation of the liquid film LF is measured by, for example, the transition device 23a. In the above-described exemplary embodiment and so forth, the transition device 23a may be configured to measure the weight of the substrate W before the formation of the liquid film LF, the same as in the present modification example. Since a weight of the liquid film LF can be calculated from a weight difference before and after the formation of the liquid film LF, it can be inspected whether the irregularity pattern of the substrate W is coated with the liquid film LF. If the weight of the liquid film LF does not reach a threshold value, an alarm or the like may be set off.

Further, the inspection unit 32d may be disposed between the drying unit 32b and the liquid film forming unit 32a when viewed from the top, instead of being stacked on or under the drying unit 32b. In this case, when viewed from the top, the liquid film forming unit 32a, the inspection unit 32d and the drying unit 32b may be arranged in a row in this sequence in the negative X-axis direction or in the positive X-axis direction.

Figure 19:
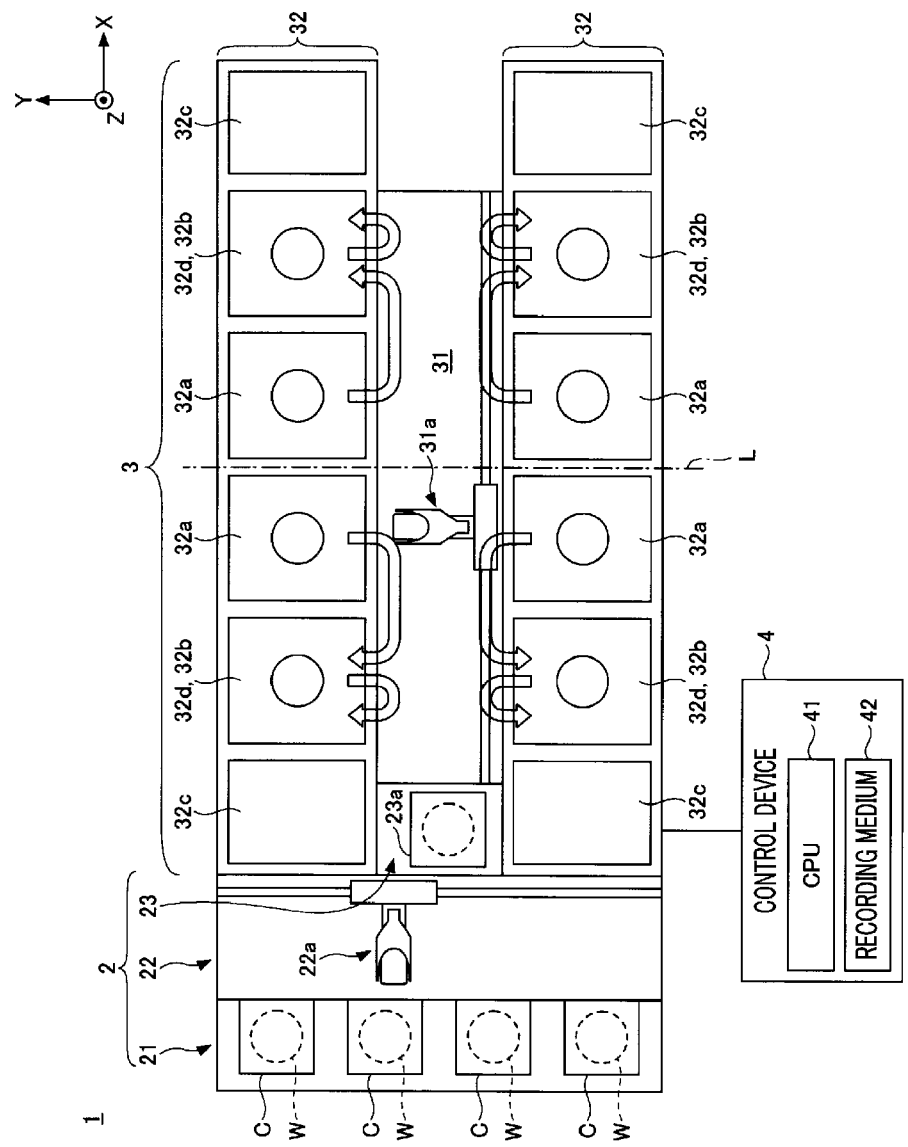
FIG. 19 is a plan view of a substrate processing apparatus according to a fourth modification example.

Now, referring to FIG. 19, a fourth modification example of the substrate processing apparatus 1 will be discussed. Below, the description will mainly focus on distinctive features between the present modification example and the above-described exemplary embodiment. In the present modification example, as illustrated in FIG. 19, corners of the rectangular carry-in/out station 2 are missing when viewed from the top, and a part of the processing block 32, more specifically, the supplying units 32c are arranged in these missing parts. Thus, the substrate processing apparatus 1 can be scaled down.

The delivery section 23 of the carry-in/out station 2 is in contact with a short side of the rectangular transfer block 31 when viewed from the top, and serves to deliver the substrate W to the second transfer device 31a. The processing block 32 is in contact with a long side of the transfer block 31 and the delivery section 23. The supplying unit 32c is in contact with the delivery section 23. Since the substrate W is not carried into/from the supplying unit 32c, the supplying unit 32c may not be in contact with the transfer block 31. Further, if the supplying unit 32c is in contact with the delivery section 23, there occurs no problem regarding the transfer of the substrate W. Further, as mentioned above, the substrate processing apparatus 1 can be scaled down.

Furthermore, in the present modification example, although each processing block 32 includes the multiple sets of the liquid film forming units 32a and the drying units 32b as in the third modification example, only one set of the liquid film forming unit 32a and the drying unit 32b may be provided. By way of example, each processing block 32 may include only one side (negative X-axis side) of the imaginary line L. In this case as well, when viewed from the top, if a corner of the rectangular carry-in/out station 2 is missing and the supplying unit 32c is disposed in this missing part, the substrate processing apparatus 1 can be scaled down.

So far, the exemplary embodiment of the substrate processing apparatus and the substrate processing method according to the present disclosure have been described. However, the present disclosure is not limited to the above-described exemplary embodiment and the like. Various changes, modifications, substitutions, additions, deletions and combinations may be made within the scope of the claims, which are all incorporated within a technical scope of the present disclosure.

According to the exemplary embodiment, it is possible to scale down the substrate processing apparatus configured to perform the supercritical drying.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus comprising a transfer block in which a transfer device configured to transfer a substrate is placed, and a processing block provided adjacent to the transfer block,
   wherein the processing block comprises a liquid film forming unit comprising a vessel having therein a spin chuck configured to hold the substrate horizontally and a nozzle configured to discharge a liquid onto a top surface of the substrate to form a liquid film on the top surface of the substrate which is held horizontally, and a drying unit configured to replace the liquid film with a supercritical fluid to dry the substrate,
   the drying unit comprises a pressure vessel having therein a drying chamber for the substrate, a cover body configured to close an opening of the drying chamber, and a supporting body configured to support the substrate horizontally in the drying chamber,
   the supporting body is fixed to the drying chamber, and
   the transfer device advances into the drying chamber through the opening of the drying chamber while holding horizontally the substrate having the liquid film formed thereon.

2. The substrate processing apparatus of claim 1,
   wherein when viewed from a top, the liquid film forming unit and the drying unit belonging to a same processing block are in contact with a long side of the transfer block having a rectangular shape, and
   the opening of the drying chamber is formed toward the transfer block.

3. The substrate processing apparatus of claim 2,
   wherein multiple sets each including the liquid film forming unit and the drying unit are provided in the same processing block.

4. The substrate processing apparatus of claim 3,
wherein when viewed from the top, one set of the liquid film forming unit and the drying unit and another set of the liquid film forming unit and the drying unit are arranged axially symmetrically.

5. The substrate processing apparatus of claim 1,
wherein the processing block includes multiple processing blocks, and
the multiple processing blocks are stacked on top of each other in a vertical direction.

6. The substrate processing apparatus of claim 5,
wherein the transfer block includes multiple transfer blocks, and
the multiple transfer blocks are stacked on top of each other in the vertical direction.

7. The substrate processing apparatus of claim 1,
wherein the processing block includes multiple processing blocks, and
when viewed from a top, the multiple processing blocks are symmetrically arranged with the transfer block therebetween.

8. The substrate processing apparatus of claim 1,
wherein the processing block further comprises an inspection unit configured to inspect a coating state of the substrate by the liquid film, and
when viewed from a top, the liquid film forming unit, the inspection unit and the drying unit belonging to a same processing block are arranged at a long side of the transfer block having a rectangular shape in a row in sequence.

9. The substrate processing apparatus of claim 8,
wherein the processing block further comprises a cleaning unit configured to radiate an ultraviolet ray to the substrate, and
the cleaning unit and the inspection unit are stacked on top of each other in a vertical direction.

10. The substrate processing apparatus of claim 7, further comprising:
a second processing block three sides of which are surrounded by the transfer block and two of the processing blocks arranged at opposite sides with the transfer block therebetween, when viewed from the top,
wherein the second processing block comprises an inspection unit configured to inspect a coating state of the substrate by the liquid film.

11. The substrate processing apparatus of claim 1,
wherein the processing block comprises an inspection unit configured to inspect a coating state of the substrate by the liquid film, and
the inspection unit and the drying unit are stacked on top of each other in a vertical direction.

12. The substrate processing apparatus of claim 1, further comprising:
a delivery section in contact with a short side of the transfer block having a rectangular shape when viewed from a top, and configured to deliver the substrate to the transfer device,
wherein the processing block further comprises a supplying unit configured to supply a fluid into the drying unit, and the processing block is in contact with a long side of the transfer block and the delivery section, and
the supplying unit is in contact with the delivery section.

13. A substrate processing method using a substrate processing apparatus comprising a transfer block in which a transfer device configured to transfer a substrate is placed, and a processing block provided adjacent to the transfer block,
wherein the processing block comprises a liquid film forming unit comprising a vessel having therein a spin chuck configured to hold the substrate horizontally and a nozzle configured to discharge a liquid onto a top surface of the substrate to form a liquid film on the top surface of the substrate which is held horizontally, and a drying unit configured to replace the liquid film with a supercritical fluid to dry the substrate,
the drying unit comprises a pressure vessel having therein a drying chamber for the substrate, a cover body configured to close an opening of the drying chamber, and a supporting body configured to support the substrate horizontally in the drying chamber,
the supporting body is fixed to the drying chamber, and
wherein the substrate processing method comprises:
forming the liquid film on the top surface of the substrate, which is held horizontally, by the liquid film forming unit;
advancing the transfer device into the drying chamber through the opening of the drying chamber, while holding horizontally the substrate having the liquid film formed thereon by the transfer device;
receiving, in the drying chamber, the substrate from the transfer device and holding the received substrate horizontally by the supporting body;
retreating the transfer device to an outside of the drying chamber through the opening of the drying chamber;
closing the opening of the drying chamber by the cover body; and
replacing, in the drying chamber, the liquid film with the supercritical fluid to dry the substrate.

* * * * *